(12) United States Patent
Sanielevici

(10) Patent No.: US 6,188,880 B1
(45) Date of Patent: Feb. 13, 2001

(54) APPARATUS AND METHOD FOR REDUCING LOW-FREQUENCY DISTORTION IN FREQUENCY CONVERTED SIGNALS

(75) Inventor: Sergio Sanielevici, Redwood City, CA (US)

(73) Assignee: Lucia Sanielevici, Redwood City, CA (US)

(*) Notice: Under 35 U.S.C. 154(b), the term of this patent shall be extended for 0 days.

(21) Appl. No.: 09/011,004

(22) PCT Filed: Nov. 4, 1997

(86) PCT No.: PCT/US97/20112

§ 371 Date: Jan. 29, 1998

§ 102(e) Date: Jan. 29, 1998

(87) PCT Pub. No.: WO98/20689

PCT Pub. Date: May 14, 1998

(51) Int. Cl.[7] .................................................. H04B 1/10
(52) U.S. Cl. ........................ 455/296; 455/305; 375/346
(58) Field of Search ............................... 455/91, 112, 114, 455/116, 118, 119, 296, 295, 305; 375/296, 346, 285

(56) References Cited

U.S. PATENT DOCUMENTS

| 4,038,540 | * | 7/1977 | Roberts | 455/305 |
| 4,370,622 | * | 1/1983 | Hornbeck et al. | 455/116 |
| 4,379,272 | * | 4/1983 | Wheatley | 455/116 |
| 4,481,426 | * | 11/1984 | Nakagawa et al. | 307/91 |
| 4,761,828 | | 8/1988 | Rinderle | 455/296 |
| 5,361,400 | | 11/1994 | Kazecki et al. | 455/63 |

* cited by examiner

Primary Examiner—Daniel S. Hunter
Assistant Examiner—Darnell R. Armstrong
(74) Attorney, Agent, or Firm—Pennie & Edmonds LLP

(57) ABSTRACT

An apparatus for reducing undesirable low-frequency distortion in a direct conversion communication receiver includes a signal generator to produce a first periodic signal and a second periodic signal. A merge circuit combines an input signal and the first periodic signal to produce a modulated signal with a polarity switched component. A frequency translation circuit converts the modulated signal into a baseband signal with a spectrum substantially equal to the modulated signal, but centered around a carrier frequency of approximately zero and including a low-frequency error component. An output modulator circuit combines the baseband signal with the second periodic signal to produce a modified baseband signal wherein the low-frequency error component is shifted to a high frequency spectrum position and the polarity switched component is eliminated. A low-pass filter subsequently removes the low-frequency error component from the modified baseband signal, resulting in a baseband output signal with reduced low-frequency distortion.

20 Claims, 4 Drawing Sheets

APPARATUS AND METHOD FOR REDUCING LOW-FREQUENCY DISTORTION IN FREQUENCY CONVERTED SIGNALS

This application claims priority to the provisional application entitled "DC Offset Reduction Method in Communication Receivers", Serial No. 60/030,347 filed Nov. 6, 1996.

BRIEF DESCRIPTION OF THE INVENTION

This invention relates generally to the elimination of low-frequency distortion in frequency converted signals. More particularly, this invention relates to a signal processing technique to reduce the unwanted DC offset signal associated with frequency conversions performed in direct conversion communication receivers.

BACKGROUND OF THE INVENTION

Radio communication systems rely upon transmitters to send modulated radio frequency signals and receivers to process the transmitted radio frequency signals. The processing of radio frequency signals commonly entails converting the relatively high frequency incoming signal to a relatively low-frequency signal, which is then demodulated to extract the useful information in the originally transmitted signal. The frequency conversion process typically introduces low-frequency distortion, commonly in the form of a dc offset signal, into the frequency converted signal. The present invention is directed toward reducing low-frequency distortion of this type.

Most receivers today. use the superheterodyne architecture, which is referred to as a single-conversion receiver, double-conversion receiver, etc., as a function of how many frequency conversions the input signal goes through before being demodulated. Typically, the demodulation is done at some convenient carrier frequency, also known as an intermediate frequency, or IF, which is low enough to allow easy amplification but high enough to accommodate the modulation bandwidth.

The "direct-conversion receiver" or "zero-IF receiver" is used to convert a signal to a very low-frequency (around zero) and perform demodulation at baseband frequencies. The main obstacle in using this architecture for high-performance receiver designs- is that the conversion to baseband frequencies always introduces DC offsets which are in general hard to eliminate if the useful signal has spectral components at zero frequency.

Solutions to this problem exist for specific modulation types, but not for the general case. One specific solution is to use AC coupling after the last frequency conversion. This solution works well for modulation methods that have a spectrum gap at the carrier frequency.

Another proposed solution described in U.S. Pat. Nos. 5,086,437 and 5,263,194 takes advantage of the idle receive time in systems with intermittent transmission in order to store the DC offset present in the absence of the input signal and then subtract the stored value when receiving the input signal.

U.S. Pat. Nos. 4,926,443; 5,241,702; and 5,442,655 describe techniques that use special properties of the modulated carrier in order to compute the added DC offset error. Spread-spectrum methods have also been used to solve the DC offset problem, as described in U.S. Pat. No. 4,736,390.

The foregoing prior art approaches solve particular problems, but are not generally applicable to all direct conversion receivers. Moreover, these prior art approaches do not provide a simple implementation that can be readily incorporated into old and new direct conversion receiver designs.

SUMMARY OF THE INVENTION

The apparatus ofthe invention includes a signal generator to produce a first periodic signal and a second periodic signal. A merge circuit combines an input signal and the first periodic signal to produce a modulated signal with a polarity switched component. A frequency translation circuit converts the modulated signal into a baseband signal with a spectrum substantially equal to the modulated signal, but centered around a carrier frequency of approximately zero and including a low-frequency error component. An output modulator circuit combines the baseband signal with the second periodic signal to produce a modified baseband signal wherein the low-frequency error component is shifted to a high frequency spectrum position and the polarity switched component is eliminated. A low-pass filter subsequently removes the shifted low-frequency error component from the modified baseband signal, resulting in a-baseband output signal with reduced low-frequency distortion.

Advantageously, the technique of the invention can be used in connection with all direct conversion receivers. Moreover, the technique is relatively easy to implement into known and future direct conversion receiver designs.

BRIEF DESCRIPTION OF THE DRAWINGS

For a better understanding ofthe nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
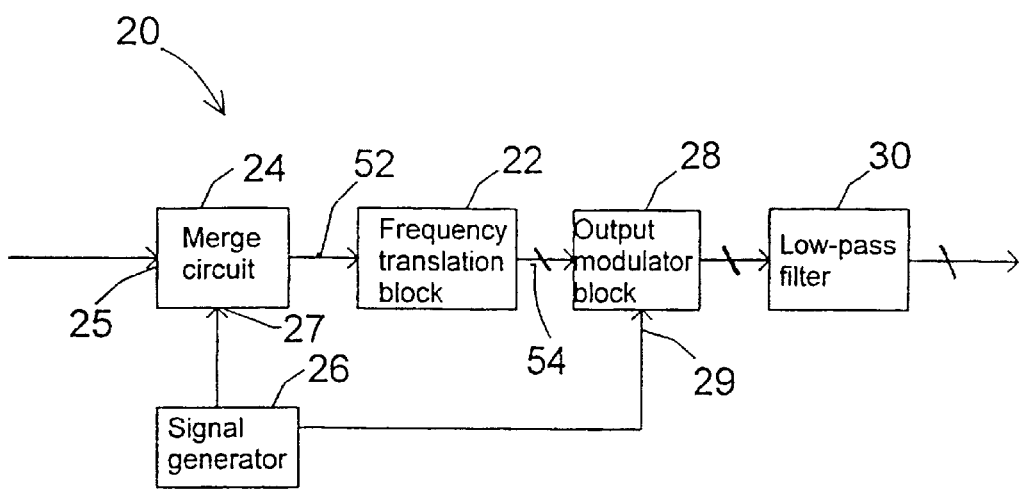
FIG. 1 illustrates a direct conversion communication receiver component with reduced low-frequency distortion in accordance with an embodiment of the invention.

FIG. 1 illustrates a direct conversion communication receiver component 20 with reduced low-frequency distortion in accordance with an embodiment of the invention. The component 20 includes a prior art frequency translation block 22, which is used to convert an incoming high frequency signal into a frequency converted baseband signal suitable for processing. In other words, the frequency translation block 22 performs a prior art direct conversion receiver function. Typically, the frequency translation block 22 linearly translates the frequency spectrum of its input signal to the baseband frequency spectrum of the baseband signal. As known in the art, the frequency translation block 22 may be implemented with one or more stages of frequency conversion. Frequency conversion stages typically include band-pass amplifiers, mixers and local oscillators, as known in the art.

As previously indicated, the direct conversion function introduces a low-frequency distortion component into the baseband signal. The present invention is directed toward eliminating this low-frequency distortion component. In brief, the present invention operates by translating the low-frequency distortion component to a high frequency and then filtering it. The translation of the low-frequency distortion component to a high frequency is achieved through a complementary modulation process, which, when completed, leaves the information content of the incoming signal unaltered. A first stage of the complementary modulation process uses a periodic signal to introduce a polarity switched component into the input signal. The second stage of the complementary modulation process uses a periodic signal to simultaneously shift the low-frequency distortion component to a high frequency and eliminate the previously introduced polarity switched component. The low-frequency distortion component is then filtered at its high frequency position, resulting in the desired baseband signal without low-frequency distortion. The baseband signal can then be processed in a standard manner.

The operation and advantages of the invention will be more fully appreciated with the following detailed description. Returning to FIG. 1, the figure illustrates a merge circuit 24. The merge circuit 24 may be implemented in a number of ways. In the embodiment of FIG. 1, it can be implemented as a signal multiplier. The merge circuit 24 receives an input signal at node 25. The input signal is a signal that carries information as a modulation of one or more sinusoidal signals. The modulation can be amplitude, frequency, phase or any combination of modulation types. The spectrum of the input signal does not cross zero frequency. In other words, the spectrum of the input signal is centered at a non-zero frequency.

A signal generator 26 is used to generate periodic signals that are used in the complementary modulation process of the invention. Practically any type of signal generator may be used as long as it performs the following functions. It must apply a periodic signal to nodes 27 and 29, or equivalent nodes. The periodic signal may be the same signal or two different signals. If different signals are used at nodes 27 and 29, then the multiplication of the first periodic signal and the second periodic signal should produce a constant number. As a result, a complementary modulation process results, as shown below.

The periodic signal on node 29 should have an approximately zero average value. Further, the periodic signal on node 29 should have a frequency spectrum that has insignificant power from zero frequency to a frequency above the maximum bandwidth of the direct conversion communication receiver. By way of example, the periodic signal may be a square wave.

Figure 2:
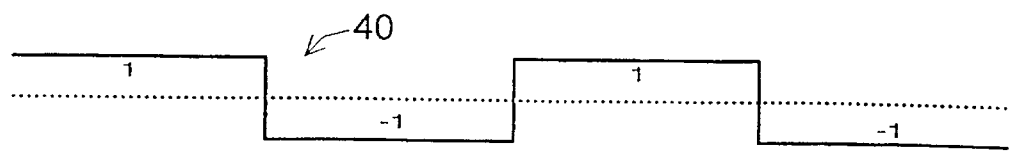
FIG. 2 illustrates a periodic signal from a signal generator utilized in accordance with an embodiment of the invention.
Figure 3:
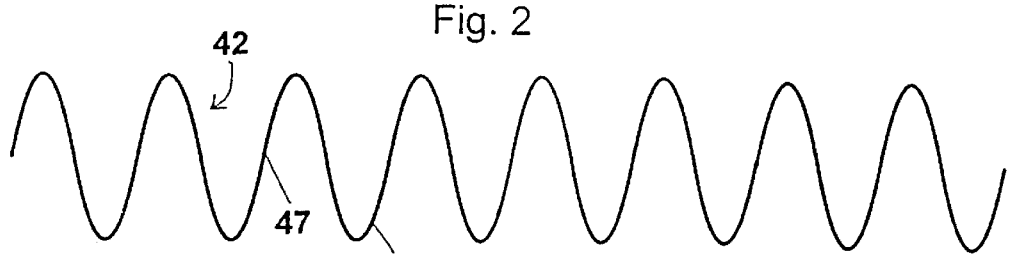
FIG. 3 illustrates an input signal processed in accordance with an embodiment of the invention.

FIG. 2 illustrates a square wave, which may be produced by the signal generator 26 in accordance with an embodiment of the invention. Returning to FIG. 1, the square wave 40 is applied to node 27 of the merge circuit 24. The merge circuit 24 also receives an input signal at node 25. An exemplary input signal is shown in FIG. 3 as waveform 42. As previously indicated, the merge circuit 24 operates to multiply the input signal 42 and the periodic signal 40 from the signal generator 26. The result of this operation is shown as waveform 44 in FIG. 4.

Figure 4:
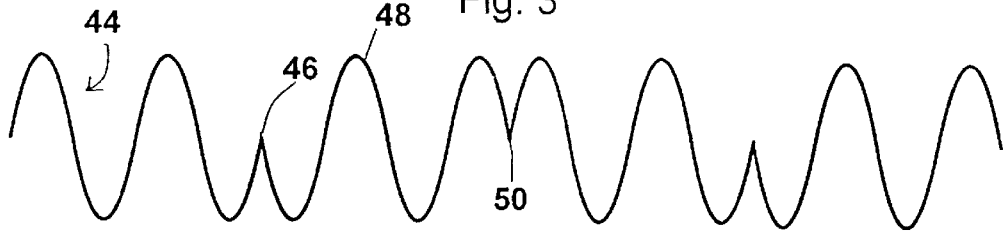
FIG. 4 illustrates a modulated signal with a polarity switched component in accordance with an embodiment of the invention.

Observe in FIG. 4 that when the first periodic signal 40 of FIG. 2 transitions to a negative value, waveform 44 experiences a polarity transition at the corresponding time, as shown at point 46. The next half cycle of the signal (peak 48) has reversed polarity with respect to the input signal (peak 49). This polarity reversal continues until the periodic signal 40 assumes a positive value, as shown at point 50 in FIG. 4. Thereafter, the signal 44 follows the input signal 42, until the next negative state of the periodic signal 40 is achieved. This phenomenon effectively introduces a polarity switched component into the input signal. Thus, FIG. 4 illustrates a modulated input signal with a polarity switched component.

The modulated input signal with a polarity switched component is then applied to the input node 52 of the frequency translation block 22. As previously indicated, the frequency translation block 22 performs a direct conversion receiver function such that the input signal is converted into a baseband signal with a spectrum substantially equal to the input signal, but centered around a carrier frequency of approximately zero and including a low-frequency error component. Since the carrier is now centered at approximately zero, the input signal, which appeared as a single physical signal, must now be represented as two physical signals, one physical signal representing an in-phase signal portion and another physical signal representing a quadrature signal portion. Node 54 of FIG. 1 is implemented with multiple paths to carry these signals.

Figure 5:
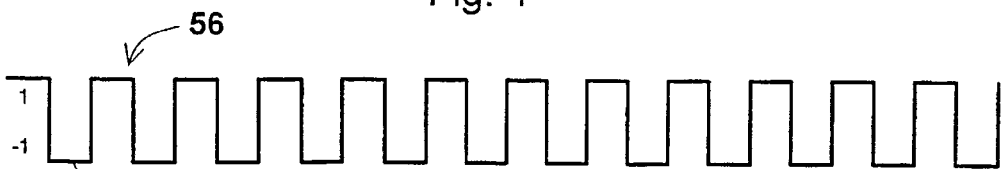
FIG. 5 illustrates the periodic signal of FIG. 2 as a higher frequency signal compared to the baseband signal with which it is combined.
Figure 6:
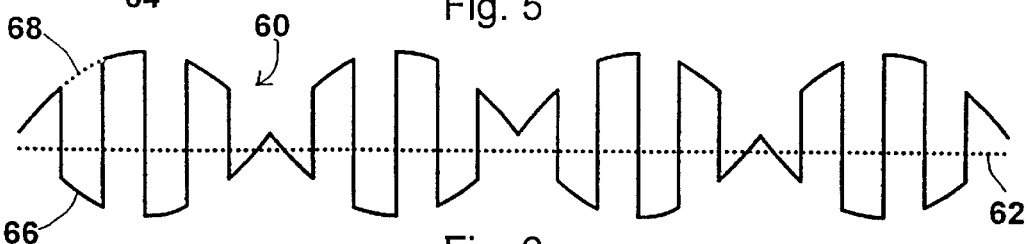
FIG. 6 illustrates the baseband signal created in accordance with an embodiment of the invention.

The output of the frequency translation block 22 is applied to an output modulator block 28. The output modulator block 28 may be implemented with a signal multiplier. The output modulator block 28 also receives a periodic signal at node 29. FIG. 5 illustrates a periodic signal 56 corresponding to the periodic signal 40 of FIG. 2. The periodic signal 56 of FIG. 5 is actually the same periodic signal of FIG. 2, but it is shown with a different frequency simply to illustrate that with respect to the frequency shifted baseband signal from the frequency translation block 22, the periodic signal 56 will have a relatively high frequency. One baseband signal from the frequency translation block 22 is shown with waveform 60 of FIG. 6. Another baseband signal (e.g., a quadrature signal) is also produced, but is not shown. The baseband signal 60 has a low-frequency distortion component (or dc offset), as reflected by the fact that the waveform 60 is centered above a zero voltage value, as depicted with line 62.

As previously indicated, the output modulator block 28 combines waveforms 56 and 60. By comparing FIG. 5 and FIG. 6, it can be appreciated that the negative portions of the periodic signal 56 will cause polarity switched components of waveform 60 to return to their original state. For example, negative portion 64 of waveform 56 will cause waveform segment 66 of waveform 60 to be inverted to its original position, as shown with dashed line 68. Thus, this operation eliminates the originally introduced polarity switched component. In this way, the invention can be interpreted as having a complementary modulation process.

Figure 7:
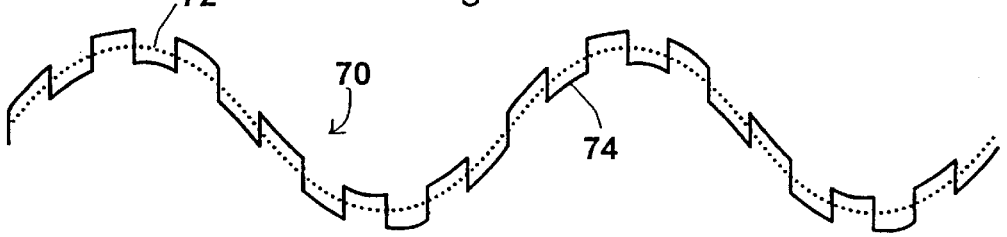
FIG. 7 illustrates a modified baseband signal with the polarity switched component eliminated.

The result of this operation is shown as waveform 70 of FIG. 7. This modified baseband signal has a recovered baseband signal 72 and a low-frequency distortion component 74. Observe that the low-frequency distortion component corresponds to the periodic signal 56 of FIG. 5. Thus, it can be appreciated that the periodic signal 56 eliminates the polarity switched component, while transforming the low-frequency distortion error component to a high frequency value, and harmonics of that value.

At this point, a standard low-pass filter 30 may be used to remove the low-frequency distortion component 74 from the in-phase and quadrature signals, to yield baseband signal 72. Preferably, the transfer function cut-off frequency of the low-pass filter is higher than the maximum frequency of the desired received signal components of the input signal and lower than the frequency of the periodic signal on node 29. The baseband signal 72 may then be processed in a standard manner.

Figure 8:
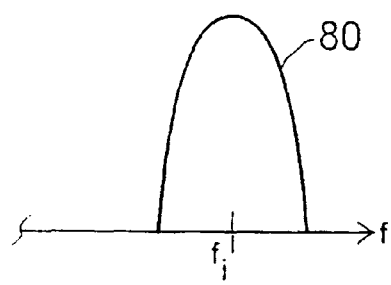
FIG. 8 illustrates the frequency spectrum of the input signal of FIG. 3.
Figure 9:
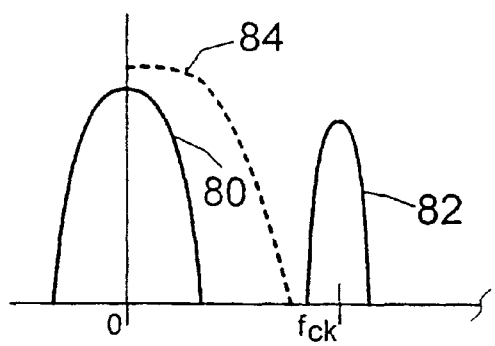
FIG. 9 illustrates the frequency spectrum of the composite signal of FIG. 7.

The operation of the invention is more fully appreciated with reference to FIG. 8. FIG. 8 illustrates the spectrum of an input signal 80, centered at a non-zero frequency of $F_i$. FIG. 9 illustrates the same waveform shifted to a zero frequency position. The figure also shows the spectrum of the low-frequency error component 82 shifted to a high frequency $F_{ck}$. In the absence of the processing of the invention, the low-frequency error component 82 would be centered at or near zero frequency. Line 84 illustrates the transfer function cut-off frequency of the low-pass filter 30. It can be appreciated in FIG. 9 that the low-pass filter 30 will eliminate the low-frequency error component 82.

Figure 10:
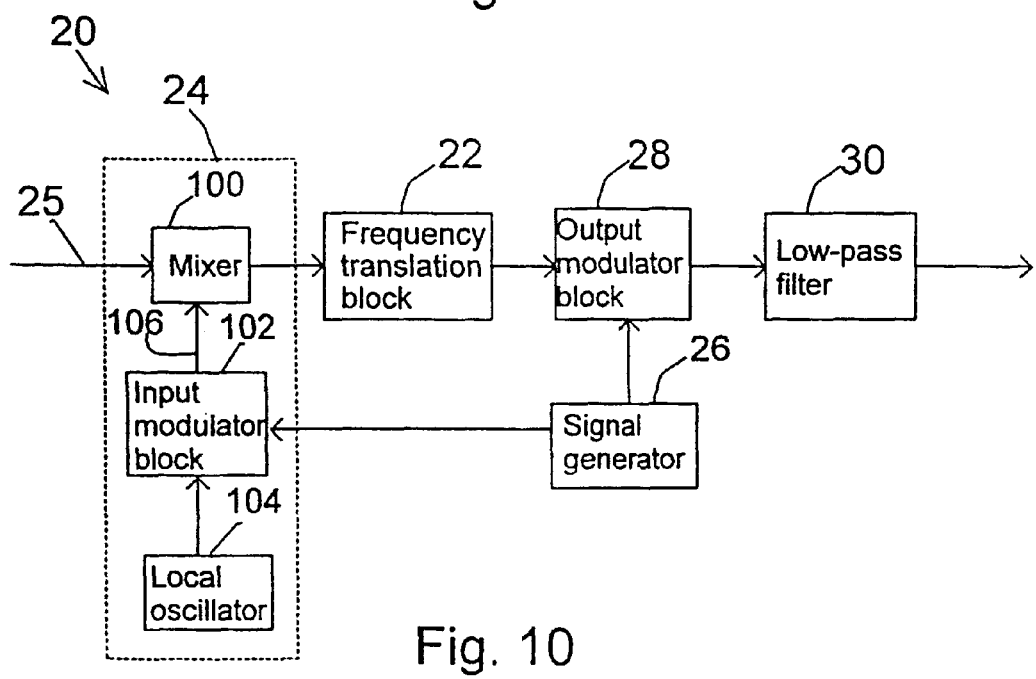
FIG. 10 illustrates a direct conversion communication receiver component with reduced low-frequency distortion in accordance with an alternate embodiment of the invention.

The invention has now been fully described. Those skilled in the art will recognize many alternate embodiments that may be used in accordance with the invention. FIG. 10 illustrates one such embodiment. FIG. 10 illustrates the device of FIG. 1, but with the merge circuit 24 implemented with a mixer 100, an input modulator block 102, and a local oscillator 104. The local oscillator 104 generates an oscillatory signal that is applied to the input modulator block 102. The input modulator block 102 may be implemented as a multiplier that combines the oscillatory signal with a periodic signal from the signal generator 26. The output of the input modulator block 102 is applied to the mixer 100. The mixer 100 is a non-linear device for combining two frequencies. The output of the mixer 100, which is the output of the merge circuit 24, is the same as in the embodiment of FIG. 1. The carrier frequency at the output of the merge circuit 24 is established as a linear combination of the carrier frequency of the input signal at node 25 and the frequency of the signal on node 106. In this embodiment, the periodic signal from the signal generator 26 is subsequently processed. As long as the subsequent processing is consistent with the parameters previously set forth for the periodic signal, the same beneficial result will be achieved.

Figure 11:
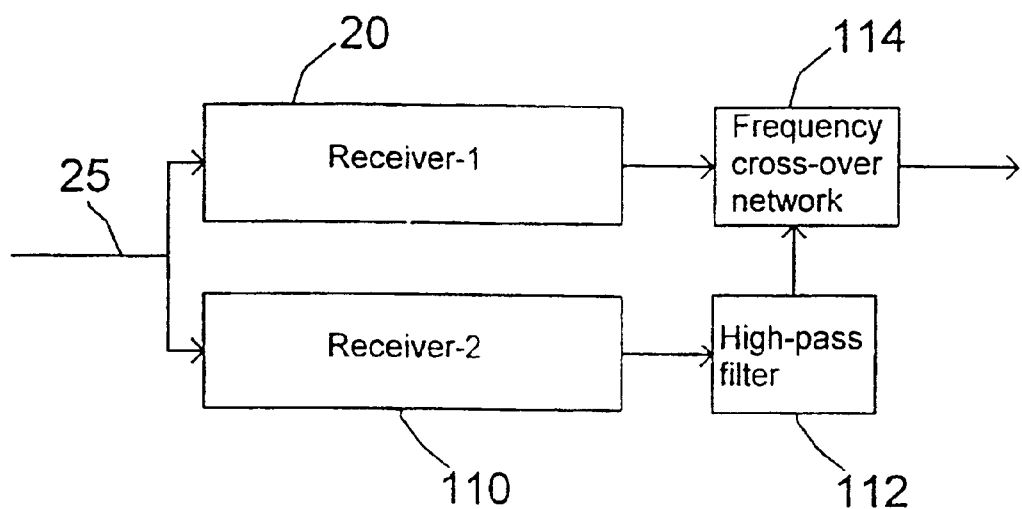
FIG. 11 illustrates a direct conversion communication receiver component with reduced low-frequency distortion in accordance with a high bandwidth embodiment of the invention.

FIG. 11 illustrates another embodiment of the invention. The apparatus of FIG. 11 uses the previously discussed direct conversion communication receiver component 20 with reduced low-frequency distortion to form a high bandwidth embodiment of the invention. The input signal on the input node 25 is applied to the apparatus 20 and to a standard receiver 110. The apparatus 20 generates the previously discussed baseband signal without low-frequency distortion. The standard receiver 110 generates a high bandwidth baseband signal, which is applied to a high-pass filter 112. The high bandwidth baseband signal has dc offset, which is reduced by the high-pass filter 112. The low cut-off frequency of filter 112 is chosen to be lower than the bandwidth of receiver 20 by a sufficient margin. The filtered high bandwidth baseband signal from the high-pass filter 112 has no dc offset, but its frequency spectrum does not extend to zero.

The filtered high bandwidth baseband signal is combined with the baseband signal from receiver 20 at a frequency cross-over network circuit 114. This results in a high bandwidth baseband output signal without low frequency distortion.

This embodiment eliminates the restriction that the signal bandwidth be smaller than the modulation frequency, which in turn has to be small for low distortion. Thus, this embodiment overcomes the inherent low bandwidth limitation associated with the previous embodiments.

Those skilled in the art will appreciate that the invention provides a generalized approach to eliminating low-frequency distortion in frequency converted signals. Advantageously, the technique of the invention can be used in connection with all direct conversion receivers. Moreover, the technique is relatively easy to implement into known and future direct conversion receiver designs.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

What is claimed is:

1. An apparatus for reducing undesirable low-frequency distortion in a direct conversion communication receiver, comprising:

a signal generator to produce a first periodic signal and a second periodic signal;

a merge circuit to combine an input signal and said first periodic signal to produce a modulated signal with a polarity switched component;

a frequency translation circuit to convert said modulated signal into a baseband signal with a spectrum substantially equal to said modulated signal, but centered around a carrier frequency of approximately zero and including a low-frequency error component;

an output modulator circuit to combine said baseband signal with said second periodic signal to produce a modified baseband signal wherein said low-frequency error component is shifted to a high frequency spectrum position and said polarity switched component is eliminated; and a low-pass filter to remove said low-frequency error component from said modified baseband signal to produce a baseband output signal with reduced low-frequency distortion.

2. The apparatus of claim 1 wherein the multiplication of said first periodic signal and said second periodic signal produces a constant number.

3. The apparatus of claim 1 wherein said signal generator produces said first periodic signal and said second periodic signal, which are the same signal.

4. The apparatus of claim 1 wherein said signal generator produces said second periodic signal with approximately zero average value.

5. The apparatus of claim 3 wherein said signal generator produces a square wave periodic signal.

6. The apparatus of claim 1 wherein said signal generator produces said second periodic signal with a frequency spectrum that has insignificant power from zero frequency to a frequency above the maximum bandwidth of said apparatus.

7. The apparatus of claim 1 wherein said input signal is a modulated signal whose spectrum does not cross zero frequency.

8. The apparatus of claim 1 wherein said merge circuit multiplies said input signal and said first periodic signal.

9. The apparatus of claim 1 wherein said merge circuit comprises:
a local oscillator to generate an oscillatory signal;
an input modulator block to combine said oscillatory signal and said first periodic signal to produce a modified first periodic signal; and
a mixer to combine said input signal and said modified first periodic signal.

10. The apparatus of claim 1 wherein said frequency translation circuit produces a baseband signal of approximately zero frequency such that the spectrum of the said baseband signal spreads on both sides of zero frequency.

11. The apparatus of claim 10 wherein said frequency translation circuit produces a baseband signal in vector form with an in-phase signal and a quadrature signal.

12. The apparatus of claim 1 wherein said output modulator circuit multiplies said baseband signal and said second periodic signal.

13. The apparatus of claim 1 wherein said low-pass filter has a transfer function cut-off frequency higher than the maximum frequency of the desired received signal components of said input signal and lower than said polarity switched component.

14. The apparatus of claim 1 further comprising
a standard receiver to process said input signal and generate a high bandwidth baseband signal;
a high pass filter to process said high bandwidth signal and thereby produce a filtered high bandwidth baseband signal; and
a frequency cross-over network to combine said filtered high bandwidth baseband signal with said baseband output signal to produce a high bandwidth baseband output signal.

15. A method of reducing undesirable low-frequency distortion in a direct conversion communication receiver, said method comprising the steps of:
merging an input signal and a first periodic signal to produce a modulated signal with a polarity switched component;
converting said modulated signal into a baseband signal with a spectrum substantially equal to said modulated signal, but centered around a carrier frequency of approximately zero and including a low-frequency error component;
combining said baseband signal with a second periodic signal to produce a modified baseband signal wherein said low-frequency error component is shifted to a high frequency spectrum position and said polarity switched component is eliminated; and
filtering said low-frequency error component from said modified baseband signal to produce a baseband output signal with reduced low-frequency distortion.

16. The method of claim 15 wherein said converting step includes the step of producing a baseband signal of approximately zero frequency such that the spectrum of the said baseband signal spreads on both sides of zero frequency.

17. The method of claim 15 wherein said converting step includes the step of producing a baseband signal in vector form with a first signal corresponding to the real part of said baseband signal and a second signal corresponding to the imaginary part of said baseband signal.

18. The method of claim 15 wherein said filtering step includes the step of establishing a transfer function cut-off frequency higher than the maximum frequency of the desired received signal components of said input signal and lower than said polarity switched component.

19. The method of claim 15 further comprising the steps of:
processing said input signal to generate a high bandwidth baseband signal;
high pass filtering said high bandwidth signal to produce a filtered high bandwidth baseband signal; and
combining said filtered high bandwidth baseband signal with said baseband output signal to produce a high bandwidth baseband output signal.

20. The method of claim 15 wherein the multiplication of said first periodic signal and said second periodic signal produces a constant number.

* * * * *